(12) United States Patent
Maier et al.

(10) Patent No.: US 9,329,244 B2
(45) Date of Patent: May 3, 2016

(54) MEASUREMENT HEAD FOR A MAGNETOELASTIC SENSOR

(75) Inventors: Carl Udo Maier, Stuttgart (DE); Jochen Ostermaier, Erlangen (DE)

(73) Assignee: SIEMENS AKTIENGESELLSCHAFT (DE)

( * ) Notice: Subject to any disclaimer, the term of this patent is extended or adjusted under 35 U.S.C. 154(b) by 39 days.

(21) Appl. No.: 14/240,421

(22) PCT Filed: Aug. 8, 2012

(86) PCT No.: PCT/EP2012/065536
§ 371 (c)(1),
(2), (4) Date: Feb. 24, 2014

(87) PCT Pub. No.: WO2013/029949
PCT Pub. Date: Mar. 7, 2013

(65) Prior Publication Data
US 2014/0232389 A1      Aug. 21, 2014

(30) Foreign Application Priority Data

Aug. 31, 2011   (DE) .................. 10 2011 081 869

(51) Int. Cl.
| G01R 33/02 | (2006.01) |
|---|---|
| G01R 33/06 | (2006.01) |
| G01R 33/09 | (2006.01) |
| G01R 33/028 | (2006.01) |
| G01R 33/18 | (2006.01) |
| G01R 33/07 | (2006.01) |

(52) U.S. Cl.
CPC .............. *G01R 33/096* (2013.01); *G01R 33/02* (2013.01); *G01R 33/028* (2013.01); *G01R 33/07* (2013.01); *G01R 33/093* (2013.01); *G01R 33/18* (2013.01); *G01R 33/09* (2013.01)

(58) Field of Classification Search
CPC ........ G01R 33/04; G01R 33/07; G01R 33/09; G01R 33/02
USPC ......................................... 324/244, 251, 252
See application file for complete search history.

(56) References Cited

U.S. PATENT DOCUMENTS

| 3,535,625 A | 10/1970 | Pratt |
|---|---|---|
| 3,798,537 A | 3/1974 | Dahm |
| 4,496,289 A | 1/1985 | Heiser et al. |
| 4,566,338 A | 1/1986 | Fleming et al. |

(Continued)

FOREIGN PATENT DOCUMENTS

| CN | 201464630 U | 5/2010 |
|---|---|---|
| CN | 102016528 A | 4/2011 |

(Continued)

OTHER PUBLICATIONS

International Search Report dated Jan. 14, 2013 issued in corresponding International patent application No. PCT/EP2012/0655-36.

(Continued)

*Primary Examiner* — Reena Aurora
(74) *Attorney, Agent, or Firm* — Ostrolenk Faber LLP

(57) ABSTRACT

A measurement head (1) for a magnetoelastic sensor having a ferrite core (3). The core (3) has a first end (5), on which a field coil (9) which generates a magnetic field is fitted, and at least a second end (7), on which a magnetic field sensor (11, 41) is fitted.

13 Claims, 2 Drawing Sheets

(56) References Cited

U.S. PATENT DOCUMENTS

| | | | |
|---|---|---|---|
| 5,107,711 A | * | 4/1992 | Aoki et al. ............... 73/862.333 |
| 5,351,555 A | * | 10/1994 | Garshelis ................. 73/862.335 |
| 5,606,260 A | | 2/1997 | Giordano et al. |
| 6,422,095 B1 | * | 7/2002 | Shimizu ................. G01L 3/102 73/862.335 |
| 8,692,545 B2 | * | 4/2014 | Shimada et al. ............. 324/209 |
| 8,890,516 B2 | | 11/2014 | Tsukada et al. ............. 324/209 |

FOREIGN PATENT DOCUMENTS

| | | |
|---|---|---|
| DE | 3208250 A1 | 9/1983 |
| DE | 93 04 629 U1 | 8/1993 |
| DE | 43 43 225 A1 | 7/1994 |
| DE | 199 41 860 A1 | 3/2004 |
| EP | 0 018 428 A1 | 11/1980 |

OTHER PUBLICATIONS

Written Opinion dated Jan. 14, 2013 issued in corresponding International patent application No. PCT/EP2012/065536.

German Examination Report dated Apr. 24, 2014 issued in corresponding German patent application No. 10 2011 081 869.3.

Office Action dated Apr. 13, 2015 issued in corresponding Chinese Patent Application No. 201280042055.8.

* cited by examiner

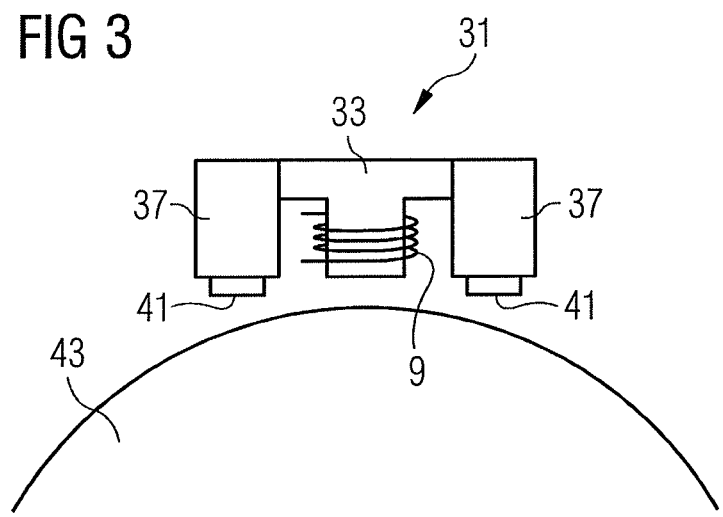
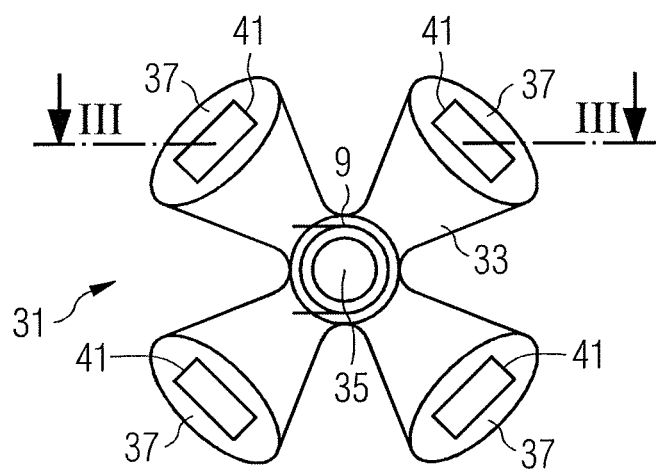

MEASUREMENT HEAD FOR A MAGNETOELASTIC SENSOR

CROSS-REFERENCE TO RELATED APPLICATIONS

The present application is a 35 U.S.C. §§371 national phase conversion of PCT/EP2012/065536, filed Aug. 8, 2012, which claims priority of German Application No. 10 2011 081 869.3, filed Aug. 31, 2011, the contents of which are incorporated by reference herein. The PCT International Application was published in the German language.

FIELD OF THE INVENTION

The present invention relates to a measurement head for a magnetoelastic sensor and to a magnetoelastic sensor having such a measurement head.

TECHNICAL BACKGROUND

A magnetoelastic sensor is based on the inverse magnetostrictive effect, that is to say the effect according to which ferromagnetic materials experience a change in magnetic permeability if mechanical stresses occur. Since mechanical stresses are induced by tensile forces and compressive forces as well as by torsion, the inverse magnetostrictive effect can be used for measuring force and/or torque, and can therefore be employed in a versatile way.

Measurement heads for measuring the inverse magnetostrictive effect comprise a transmission coil or exciter coil with which a magnetic field is induced in the ferromagnetic layer. In this context, a response signal having a magnetic flux density that depends on the permeability of the layer is generated in the layer. The permeability is determined in turn by the mechanical stresses present in the layer. The magnetic flux density of the response signal determines the strength of the current induced in the reception coil owing to the magnetic flux density penetrating it. The mechanical stresses in the ferromagnetic layer can therefore be calculated on the basis of the strength of the current.

However, owing to fabrication tolerances the reception coils, and therefore the measurement heads, have limited reproducibility in the manufacture and limited accuracy during measurement.

SUMMARY OF THE INVENTION

The object of the present invention is therefore to make available a measurement head for a magnetoelastic sensor which permits a higher level of reproducibility in the manufacture and improved accuracy during measurement. A further object of the invention is to make available an advantageous magnetoelastic sensor.

The objects are achieved by the invention.

A measurement head according to the invention for a magnetoelastic sensor comprises a ferrite core having a first end on which an exciter coil (also referred to as a transmission coil), which generates a magnetic field, is mounted, and having at least a second end to which a magnetic field sensor is attached. In this context, in particular, a magnetic field sensor which is based on the Hall effect, a magnetic field sensor which is based on the GMR (giant magneto resistance) effect or a magnetic field sensor which is based on the AMR (anisotropic magnetoresistive effect) is possible here as the magnetic field sensor.

The sensitivity of the measurement head can be improved by using a magnetic field sensor instead of a simple reception coil for detecting the response signal which is induced by the exciter coil in a ferromagnetic layer. Furthermore, the magnetic field sensors can be manufactured with lower fabrication tolerances than the reception coils which are difficult to manufacture. As a result, the measurement head according to the invention can be manufactured more easily and more cost-effectively. Furthermore, the variability of the manufactured measurement heads is reduced owing to the reduced tolerances.

The ferrite core on which the transmission coil and the magnetic field sensor are arranged can be in the shape of, in particular, a U. The U shape has two limbs which comprise the ends of the ferrite core. In this context, the exciter coil is arranged on one limb of the U-shaped ferrite core, and the magnetic field sensor is arranged on the other limb of the U-shaped ferrite core.

Alternatively, the ferrite core can have a central limb and at least two outer limbs which surround the central limb and are connected thereto, wherein the ends of the ferrite core are located on the limbs. In this configuration, the exciter coil is arranged on the central limb of the ferrite core, and the magnetic field sensors are arranged on the outer limbs of the ferrite core. In this context it is, in particular, advantageous if the outer limbs surround the central limb at a respective equal distance since then the signals which are received by the magnetic field sensors are not influenced by different distances between the respective limbs and the exciter coil.

If there are two outer limbs, the ferrite core can be, in particular, in the shape of an E. As a result, the distance through the ferromagnetic material to be measured can be increased compared to the U shape, which results in improved sensitivity of the measurement head. In this refinement, the magnetic field sensors are preferably located opposite to one another in a mirror symmetrical fashion with respect to the exciter coil, in order to exclude influences on the measurement which are due exclusively to the different distances from the exciter coil.

If the ferrite core has more than two outer limbs, the magnetic field sensors can be arranged around the ferrite core in, in particular, a point symmetrical fashion or rotationally symmetrical fashion. In particular when four outer limbs are present, it is possible in this way for stresses which run in the ferromagnetic layer in directions which are perpendicular to one another to be satisfactorily detected. Such measurement heads may be particularly advantageously used for measuring torsion and torques, for example in shafts.

According to a second aspect of the invention, a magnetoelastic sensor is made available. The latter has a measurement head according to the invention, with the result that the properties and advantages described with respect to the measurement head are implemented therein.

Further features, properties and advantages of the present invention are found in the following description of exemplary embodiments with respect to the appended figures, of which:

BRIEF DESCRIPTION OF THE DRAWINGS

FIG. 3 shows a further exemplary embodiment of a magnetoelastic sensor according to the invention in a side view, and FIG. 4 shows the measurement head of a sensor from FIG. 3 in a plan view.

DESCRIPTION OF EMBODIMENTS

Figure 1:
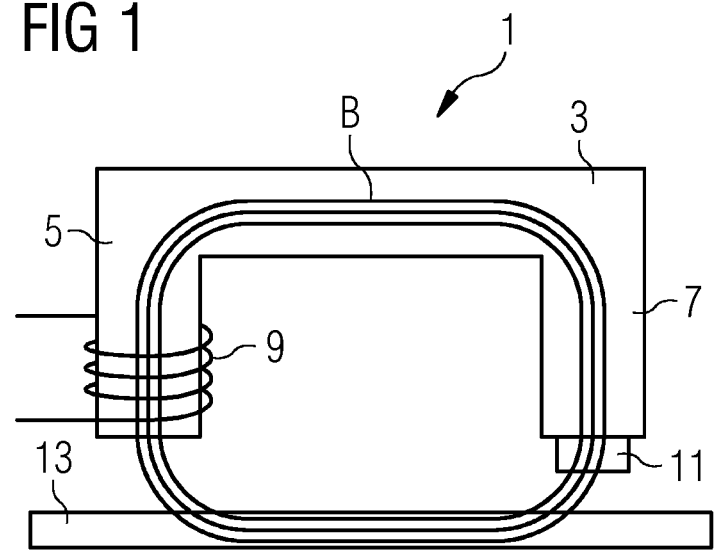
FIG. 1 shows an exemplary embodiment of a magnetoelastic sensor according to the invention with a U-shaped measurement head.

A first exemplary embodiment of a measurement head according to the invention and a magnetoelastic sensor equipped therewith is illustrated in FIG. 1. The measurement head 1 comprises a U-shaped ferrite core 3 which has two limbs 5 and 7 which are oriented parallel to one another. An exciter coil 9, with which a magnetic field can be generated, is mounted on the first limb 5. A magnetic field sensor 11, which is embodied as a Hall sensor in the present exemplary embodiment, is arranged on the second limb 7.

The measurement head forms, together with a ferromagnetic layer 13 which is arranged on an object in which stresses are to be measured, a magnetoelastic sensor. The layer 13 can be mounted here on the object to be measured. Alternatively, the object to be measured can, however, itself also be composed of a ferromagnetic material. In this case, the magnetoelastic sensor is formed by the object itself together with the measurement head 1.

For the measurement process of the sensor, a magnetic field having magnetic flux density, which is illustrated in FIG. 1 by means of the field lines B, is generated by means of the exciter coil 9. The field lines run through the ferromagnetic layer 13 and are closed via the ferrite core 3. The magnetic flux density of the magnetic field can be measured by means of the magnetic field sensor (here the Hall sensor) 11. The measurement value depends here on the magnetic permeability in the ferromagnetic layer 13, which is influenced in turn by the stresses present in the ferromagnetic layer. Therefore, the stresses present in the ferromagnetic layer 13 can be calculated on the basis of the measurement result acquired for the magnetic flux density with the magnetic field sensor 11. Since the ferromagnetic layer 13 either constitutes the object itself or is connected to the object, the stresses present in the ferromagnetic layer 13 also represent the stresses present in the measured object.

Figure 2:
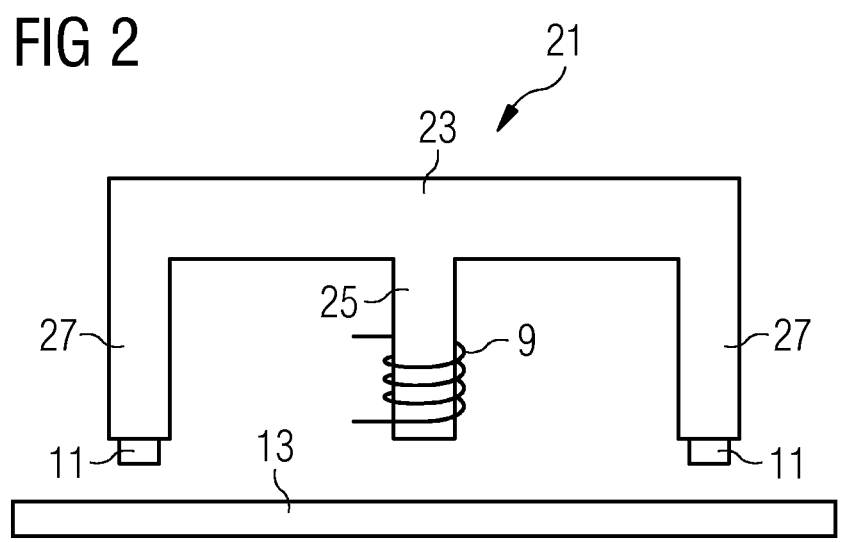
FIG. 2 shows an exemplary embodiment of a magnetoelastic sensor according to the invention with an E-shaped measurement head.

A second exemplary embodiment of a measurement head according to the invention and a magnetoelastic sensor comprising the measurement head is illustrated in FIG. 2. Elements which correspond to those of the first exemplary embodiment are characterized by the same reference symbols as in FIG. 1 and are not explained once more in order to avoid repetitions. The explanation of the second exemplary embodiment is therefore restricted to the differences from the first exemplary embodiment.

In contrast to the first exemplary embodiment, the measurement head 21 of the second exemplary embodiment has an E-shaped ferrite core 23. The latter comprises a central limb 25 and two outer limbs 27 which are arranged on an axis with the central limb 25. All the limbs are preferably oriented parallel to one another. The outer limbs 27 have both the same distance from the central limb 25, with the result that there is a mirror symmetrical geometry of the ferrite core 23 with respect to the central limb 25.

The exciter coil 9 of the measurement head 21 is arranged on the central limb of the ferrite core 23. The magnetic field sensors 11, which are embodied as Hall sensors as in the first exemplary embodiment, are located on the two outer limbs 27 of the ferrite core 23. The magnetic flux density of the magnetic field which is generated by the exciter coil 9 is measured in this embodiment variant at two locations which are located opposite one another in a mirror symmetrical fashion with respect to the exciter coil 9.

A third exemplary embodiment of a measurement head according to the invention and a magnetoelastic torsion sensor which is constructed therewith is illustrated in FIGS. 3 and 4. FIG. 3 shows here a side view through the measurement head along the line III-III in FIG. 4. FIG. 4 shows a plan view on the side of the measurement head which is to face the ferromagnetic material.

The measurement head 31 of the third exemplary embodiment has a ferrite core 33 with a central limb 35 and four outer limbs 37 which surround the central limb 35. The exciter coil 9 is arranged on the central limb 35. The magnetic field sensors 41, which are embodied in the present exemplary embodiment as GMR sensors or AMR sensors, are located on the outer limbs 37. The geometry of the ferrite core 31 is selected in the present exemplary embodiment in such a way that the limbs form two limb pairs, in each of which two limbs are located opposite one another on opposing sides of the central limb 35. The two limb pairs have an orientation which is rotated through 90° with respect to one another, with the result that point symmetry is present in the arrangement of the outer limbs 37 with respect to the central limb 35. This configuration of the measurement head 31 permits two dimensional detection of forces, as this is advantageous, for example, for measuring torsion in a shaft 43 or torques of a shaft. The shaft 43 may be composed here either of a ferromagnetic material or may be coated with such a material.

For the determination of the torsion on the shaft 43, the sensor head is oriented with the connecting line between outer limbs 37, located opposite one another, of a limb pair along which main forces occur in the case of torsion, wherein the forces run perpendicularly with respect to one another. In the case of torsion, a tensile force is present in one direction and a compressive force in another direction which is perpendicular to the one direction. This means that the magnetic permeability of the ferromagnetic material of the shaft 43 becomes greater in the one direction and smaller in the other direction. By means of the geometry of the sensor head 31 which is illustrated in FIG. 3 and FIG. 4, the permeabilities in the two directions can be detected separately from one another, with the result that the torsion of the shaft can be determined from the detected permeabilities and the tensile or compressive stresses which are calculated therefrom.

Deviations from the exemplary embodiments which are presented are possible. For example in the first two exemplary embodiments, it is thus also possible to use another magnetic field sensor, for example a GMR sensor or AMR sensor instead of the Hall sensor which is used.

The symmetries which are described with respect to the second exemplary embodiment and the third exemplary embodiment are, however, advantageously not absolutely necessary since the influences of the measurement signals which occur in the case of a nonsymmetrical arrangement can basically be taken into account during the processing of the measurement signals. In a nonsymmetrical geometry of the E-shaped ferrite core it is possible, for example, for the outer limbs to be at different distances from the central limb. Furthermore, the outer limbs and the central limb do not necessarily need to be arranged on a line. Correspondingly, in the case of the measurement head of the third exemplary embodiment it is not necessary for the positions of the outer limbs of the ferrite core to have point symmetry with respect to the central limb. Furthermore, it is also not necessary for four limbs to be present. Three limbs are basically sufficient to detect two-dimensional forces. These can then be arranged, for example, at the corners of a polygon with the central limb as a center. The same also applies independently of the number of the outer limbs which are present. However, a completely nonsymmetrical arrangement of the outer limbs is basically also possible. However, the evaluation of the signals of a measurement head which is equipped with four symmetrically arranged limbs is simpler, in particular if said measurement head has the geometry which is shown in FIGS. 3 and 4.

As a further refinement of the exemplary embodiment shown, it is possible for a magnetic field sensor also to be arranged on the limb which bears the exciter coil.

The present invention has been described with reference to exemplary embodiments for illustration purposes. However, the exemplary embodiments are not intended to restrict the invention, and therefore the scope of protection is limited only by the appended claims.

The invention claimed is:

1. A magnetoelastic sensor comprising:
    a measurement head that includes a ferrite core having a first part around which an exciter coil is arranged to generate a magnetic field in the ferrite core, and at least a second part to which a magnetic field sensor is attached,
    wherein the first part terminates at a first surface,
    wherein the second part terminates at a second surface,
    wherein the magnetic field sensor is disposed over the second surface,
    wherein the exciter coil is arranged to generate a magnetic field with magnetic field lines that pass through the first surface, the second surface, and the magnetic field sensor, and
    wherein the first surface, the second surface, and the magnetic field sensor are arranged to sense magnetic field flux density variation in a ferromagnetic body arranged opposite and spaced from the first surface, the second surface, and the magnetic field sensor to receive therein the field lines that pass through the first surface, the second surface, and the magnetic field sensor.

2. The magnetoelastic sensor as claimed in claim 1, wherein the magnetic field sensor is configured to be based on the Hall effect.

3. The magnetoelastic sensor as claimed in claim 1, in which the magnetic field sensor is configured to be based on the GMR effect.

4. The magnetoelastic sensor as claimed in claim 1, in which the magnetic field sensor is configured to be based on the AMR effect.

5. The magnetoelastic sensor as claimed in claim 1, wherein the ferrite core is U-shaped, the first part comprising a first limb of the ferrite core, and the second part comprising a second limb of the ferrite core.

6. The magnetoelastic sensor as claimed in claim 1, wherein the ferrite core comprises a central limb and at least two outer limbs which are located outside, spaced apart and around, and connected to the central limb, wherein;
    the central limb comprises the first part;
    at least one of the outer limbs comprises the second part, and the other one of the outer limbs comprises a third part terminating at a third surface having another magnetic sensor thereover.

7. The magnetoelastic sensor as claimed in claim 6, wherein the outer limbs are spaced from the central limb at a respective equal distance.

8. The magnetoelastic sensor as claimed in claim 6, wherein the ferrite core is E-shaped and comprises the central limb and the two outer limbs connected together.

9. The magnetoelastic sensor as claimed in claim 8, wherein the outer limbs are located opposite one another in a mirror symmetrical configuration with respect to the central limb.

10. The magnetoelastic sensor as claimed in claim 6, wherein the ferrite core has a central limb and at least a third outer limb.

11. The magnetoelastic sensor as claimed in claim 10, wherein the at least three outer limbs are arranged around the central limb in a point symmetrical configuration or a rotationally symmetrical configuration.

12. The magnetoelastic sensor as claimed in claim 1, wherein the ferrite core is shaped so that the first part is a first terminal end of the ferrite core and the second part is a second terminal end of the ferrite core.

13. The magnetoelastic sensor as claimed in claim 1, further comprising a ferromagnetic body disposed opposite and spaced from the first surface, the second surface, and the magnetic field sensor.

* * * * *